United States Patent [19]

Gross

[11] 4,228,713
[45] Oct. 21, 1980

[54] PROGRAMMABLE CURRENT SOURCE FOR FILTER OR OSCILLATOR

[75] Inventor: Glenn Gross, Chicago, Ill.

[73] Assignee: Norlin Industries, Inc., Lincolnwood, Ill.

[21] Appl. No.: 921,195

[22] Filed: Jul. 3, 1978

Related U.S. Application Data

[63] Continuation-in-part of Ser. No. 835,695, Sep. 22, 1977, Pat. No. 4,186,642.

[51] Int. Cl.³ ............................................. G10H 1/02
[52] U.S. Cl. ............................. 84/1.19; 84/DIG. 9; 84/1.01; 331/177 R
[58] Field of Search ................... 84/1.01, 1.19, 1.26, 84/DIG. 8, DIG. 9; 331/177 R, 177 V

[56] References Cited

U.S. PATENT DOCUMENTS

| 3,943,456 | 3/1976 | Luce | 84/1.01 |
|---|---|---|---|
| 3,974,461 | 8/1976 | Luce | 84/1.19 |
| 4,002,095 | 1/1977 | Mantani | 84/1.01 |
| 4,083,286 | 4/1978 | Faulkner | 84/1.26 |

OTHER PUBLICATIONS

Girling and Good, Active Filters, Wireless World, Mar. 1970, pp. 138–139.

Primary Examiner—J. V. Truhe
Assistant Examiner—Forester W. Isen
Attorney, Agent, or Firm—Jack Kail; Ronald J. Kransdorf

[57] ABSTRACT

In order to tune the frequency characteristics of a filter or oscillator as an exponential function of the position of a note on a musical scale, a pulse stream with an exponentially scaled duty cycle is used to gate an on-off switch which controls an electronic tuning signal for the first or second stage of the filter or oscillator. The pulse stream source can be a pulse code generator responsive to a priority note generator, or it can be an oscillator-driven one-shot with an exponentially scaled power supply governing the charging rate of a reactive component which determines the one-shot cycle time. There are also pitch offset and pitch modulation features in the circuit, the latter being usable in a constant deviation or a constant interval mode.

23 Claims, 10 Drawing Figures

PROGRAMMABLE CURRENT SOURCE FOR FILTER OR OSCILLATOR

CROSS-REFERENCE TO RELATED PATENT APPLICATION

This application is a continuation-in-part of my earlier U.S. patent application entitled "Programmable Circuits for Electronic Musical Instruments", Ser. No. 835,695, now U.S. Pat. No. 4,186,642, filed Sept. 22, 1977, which is assigned in common with the present application.

BACKGROUND OF THE INVENTION

This invention relates to electronic musical instruments, particularly those employing tunable circuits such as voltage-controlled oscillators and voltage-controlled filters.

Electronic musical instruments typically employ electronically tunable frequency-dependent circuits such as voltage-controlled oscillators (VCO's) and voltage-controlled filters (VCF's). The oscillators are used as musical tone signal sources, and the filters are used to process tone signals to achieve desired musical effects. The tuning is conventionally accomplished by applying an electronic control signal to select the operating frequency of the oscillator or the frequency characteristics of the filter. The tunable oscillator and filter circuits are commonly denominated "voltage-controlled". In most instances it is actually the control signal current which governs the tunable frequency characteristics, but ordinarily the current input to the tunable circuit is a function of the signal voltage, so the name is not entirely a misnomer even when current is the controlling parameter.

It is recognized in the electronic musical instrument art that pitch varies exponentially with position on the musical scale. For example, in terms of musical scale distance, middle C is halfway between the two notes an octave below and an octave above it; i.e. the scale is linear. But the frequency of middle C is not halfway between the frequencies of those other two notes; on the contrary, the frequency of middle C is twice that of the octave below it, while the upper octave frequency (twice the frequency of middle C) is four times the frequency of the octave below middle C. Thus, if the oscillator or filter tuning signal is linearly proportional to the musical scale position of a selected note, some means must be used to convert this linear relation into an exponential one.

The prior art has typically accomplished this (and incidentally accomplished the necessary voltage to current conversion as well) by using a conventional bipolar junction transistor as a signal conversion device. The transistor is first biased into the exponential region of its characteristic response curve, and then an input signal voltage linearly proportional to the musical scale position of the selected note is applied across its base and emitter electrodes. The resulting collector output current is an exponential function of the input voltage, and hence of the musical scale position of the selected note. Such an exponentially related current output is exactly what is needed to provide a tuning control signal for the so-called VCO's and VCF's discussed above. VCO and VCF circuits employing such control circuits are described in considerable detail in "Musical Engineer's Handbook", 1975 edition, Chapters 5 b and 5 d respectively. The foregoing work is available from the author and publisher, Bernie Hutchins, at 1 Pheasant Lane, Ithaca, New York 14850.

The problem with using bipolar transistors as exponential conversion devices in this fashion is that they drift with temperature and age. While various adjustment and compensation techniques are available, it is deemed preferable to attack the problem by providing an entirely different type of exponential conversion circuit, as the present invention does.

SUMMARY OF THE INVENTION

The present invention provides a tuning signal, the controlling parameter of which is linearly proportional to the musical scale position of a particular note, for example, a note selected by operating a conventional musical keyboard. Before the signal is used, however, to control a tunable circuit such as the first or second stage of VCO or VCF, it is chopped by an on-off switch under the gate control of a stream of pulses having a duty cycle which is related exponentially to the musical scale position of the selected note. As a result, the controlling parameter of the tuning signal is exponentially modulated. The exponential pulse stream can be generated by digital techniques, or by the use of appropriately scaled resistors to govern the charging rate of a capacitor or other reactive component in a time-base circuit. In either case, the circuit exhibits superior stability over temperature and with age.

BRIEF DESCRIPTION OF THE DRAWINGS

Exemplary and preferred embodiments of the invention will now be described in detail, with reference to the following diagrams.

DESCRIPTION OF THE PREFERRED EMBODIMENTS

Figure 1:
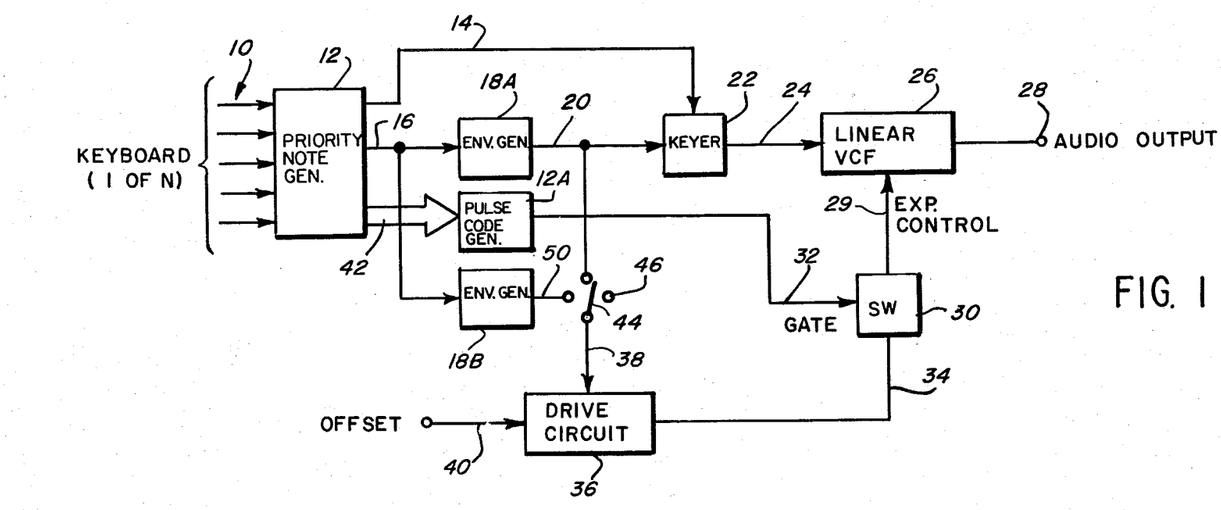
FIG. 1 is a block diagram showing a portion of an electronic musical instrument embodying the invention, in which the tunable circuit is a VCF, and the exponential pulse stream is generated by digital techniques employing a priority note generator and a pulse code generator.

FIG. 1 illustrates in general terms one form of the invention. The circuit there shown is a fragment of an electronic musical instrument, the omitted portions of which are either conventional or are disclosed in detail in the above-cited earlier patent application. The musical instrument is preferably one of those which has a keyboard, such as a synthesizer or organ. Each of the keys on the keyboard, when operated by the musician, closes a switch which energizes an individual one of the note selection signal lines 10. In response to this signal, the circuit of FIG. 1 generates and processes an electronic tone signal, the fundamental frequency of which is equal to the pitch of a selected musical note. That note may be either the note represented by the particular key which the musician has depressed, or it may be another note having a predetermined harmonic relationship to the key note.

The circuit which generates the electronic tone signal is a priority note generator 12, a specialized digital circuit which is preferably realized in the form of an integrated circuit. In brief terms, the priority note generator is a circuit in which a high frequency clock pulse train is divided down to any desired musical frequency by means of a digitally controlled programmable divider to produce a musical tone signal. Further details of the priority note generator and its operation are disclosed in the earlier patent application cited above, and also in the co-pending U.S. patent application of Richard S. Swain and Douglas Moore entitled "Tone Generating System for Electronic Musical Instrument", Ser. No. 835,832, now U.S. Pat. No. 4,186,637 filed Sept. 22, 1977, which is assigned in common with this application. The priority note generator has a number of output lines. Line 14 is the one on which the tone signal appears. At the same time that it produces the tone signal on line 14, the priority note generator 12 produces a drive signal on line 16 to activate one or more envelope generator circuits 18. The latter respond to the input on line 16 by producing an envelope signal which mimics the onset and decay of an acoustical tone over time. The envelope generator 18a produces its envelope output on line 20, which is connected to activate a keyer circuit 22. The keyer circuit also receives the tone signal on line 14 from the priority note generator 12. The keyer uses the envelope signal to modulate, at sub-audio frequencies, the audio frequency tone signal. The resulting keyer output, on line 24, is an electrical representation of a musical note having the same audio frequency as the tone signal on line 14, and the onset and decay characteristics of the envelope signal on line 20.

The envelope generator circuits 18 and the keyer 22 may be conventional, and in any event are described in detail in the above-mentioned Gross patent application.

The envelope-modulated audio signal on line 24 normally requires further processing by a filter circuit, preferably a conventional voltage-controlled filter (VCF) 26 which changes its frequency response characteristics linearly in response to a control signal applied over line 29. The linear VCF, which makes the filtered audio output signal available at terminal 28, is a conventional circuit described in the above mentioned Hutchins text.

As so far described, the circuit is in part conventional and in part the subject of the two co-pending patent applications cited above. The present application, however, focuses on ways of assuring that the filter control signal on line 29 is an exponential function of the musical scale position of the note being played (i.e. the note represented by the energized one of the input lines 10). Since the VCF responds linearly to the control signal on line 29, if that signal is exponentially related to the musical scale position of the note, then the VCF response will also be exponentially related to the musical scale position of the note. Since musical frequency (or pitch) is exponentially related to musical scale position, then the VCF will accurately track the pitch of the notes played on the keyboard.

In accordance with this invention, the filter control signal on line 29 is governed by an electronic switch 30, for example an MOS integrated circuit, catalog number CD 4016 or equivalent, which turns fully on in response to the presence of an enabling input on its gate input line 32, and turns fully off when that gate input is absent. The source of the filter control signal which is applied to the gate 30 over line 34 is a drive circuit 36. The drive output is not a function of note selection; i.e. it does not depend on which of the n keyboard lines 10 is energized. Instead, the drive signal depends only on the shape of an envelope input arriving on line 38 and an offset instruction signal which may arrive on line 40. For a given condition of these inputs 38 and 40, the drive output on line 34 is the same for whatever musical note selection is mandated by the keyboard lines 10. Thus the responsibility for imparting the desired exponential characteristic to the filter control signal on line 29, as a function of musical note selection, rests entirely with the gate signal on line 32.

The latter is derived from a circuit 12a, referred to as a pulse code generator, which responds to musical note selection information contained in a multi-bit digital code instruction word arriving over a cable 42 from the priority note generator 12. The pulse code generator 12A is preferably realized as part of the same I.C. chip as the priority note generator 12. Various different embodiments of pulse code generators, all suitable for the present application, are disclosed in connection with FIGS. 11 through 17 of the above-cited Gross application. Each of these circuits is basically a digitally controlled set of gates which selectively passes or blocks a pulse stream in such a way that the output pulse train has certain desired time patterns dictated by the input instructions to the gates. The input instructions vary according to the musical note selection at the keyboard. Each of the possible pulse code generator embodiments produces as its output a train of pulses; in some of them these output pulses have a repetition rate which is constant for all musical note selection conditions, but the individual pulse duration varies as a function of the musical scale position of the selected note. In other circuits the output pulse duration is constant for all musical note selection conditions, but the output pulse repetition rate varies as a function of the musical scale position of the selected note. Whether the pulse train is duration-modulated or repetition-rate modulated, in either case the average duty cycle of the pulse train is a function of note selection. Furthermore, in the circuits described in the above-cited patent applications, the pulse duty cycle varies exponentially with musical scale position. The pulse train output on gate line 32 necessarily turns the switch 30 on each time there is a pulse, and off each time the pulse terminates. Since the pulse train is duty-cycle-modulated as an exponential function of musical scale position, the on-off duty cycle of switch 30 is similarly modulated, which is exactly what is required to provide an exponential control signal on line 29 to the VCF.

To complete the discussion of FIG. 1, the inputs to the filter control drive circuit 36, although conventional, will be described. The modulation input on line 38 can be taken from either of two sources or shut off entirely by means of a panel switch 44. If the switch selects the off position (terminal 46), then there is no input to the drive circuit 36 on line 38. As a result, the effect of drive circuit 36 on the frequency response of the filter 26 will be unvarying throughout the rise and fall of the musical tone envelope signal generated by circuit 18A. On the other hand, in some types of electronic musical instruments, such as synthesizers, it may be desirable for the frequency response of the filter 26 to vary over time as a function of a rising and falling envelope voltage. If this is desired, switch 44 can connect the drive circuit modulation input line 38 via line 20 to the same envelope generator 18A which shapes the musical tone output, or it can connect it over line 50 to a separate envelope generator 18B which has a different rise and fall characteristic from circuit 18A. The latter alternative permits the amplitude of the musical tone and its frequency characteristics to vary over time in different ways. The alternate envelope generator 18B is similar to the primary envelope generator 18A, except for component values, and responds in the same way to the signal derived over line 16 from the priority note generator 12.

Finally, there is a constant offset or reference voltage input on drive circuit input line 40. Internal circuitry within box 36 (to be described below) uses this offset voltage to determine whether the center frequency to which the filter 26 is tuned is the pitch of the selected musical note, or another pitch harmonically related to it. In the former case, the filter 26 is tuned to a center frequency equal to the pitch of the keyboard selected note, or, if one of the modulation inputs on line 20 or 50 is selected by the switch 44, the initial value of the modulation voltage tunes the filter initially to that center frequency as the starting point for its frequency sweep. Alternatively, the internal circuitry of box 36 can use the offset reference voltage in such a way that the center frequency (or initial center frequency) of the filter is a selected musical interval above or below the frequency of the keyboard-selected note, thus affording further flexibility in the choice of harmonic effects.

Figure 2:
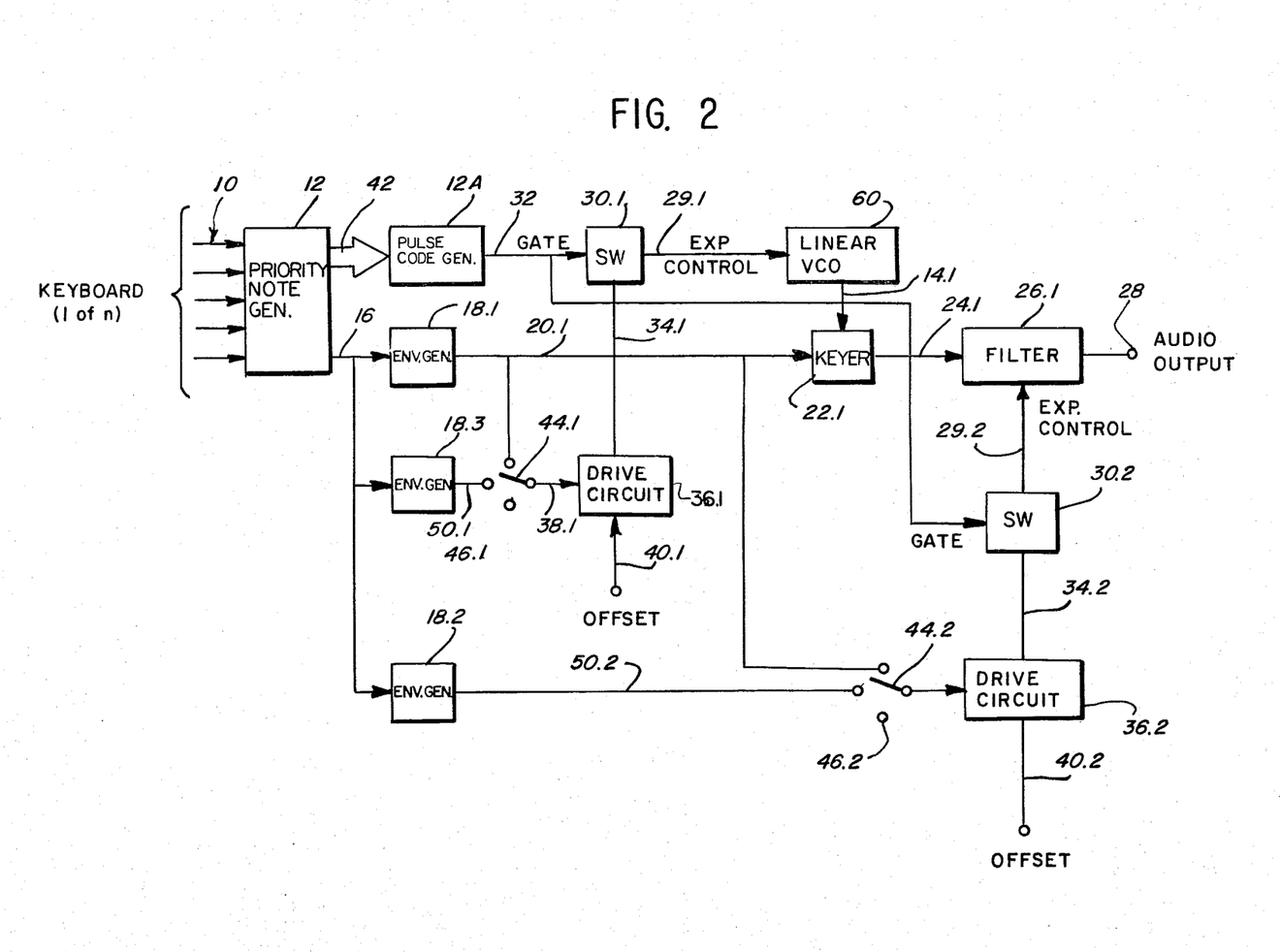
FIG. 2 is a block diagram showing a similar instrument in which both a VCF and a VCO are tuned by the same digital technique.

FIG. 2 shows a variant of the FIG. 1 circuit in which the priority note generator is not employed as a musical tone source. Thus its tone signal output (line 14 of FIG. 1) is not used at all in FIG. 2. Instead there is a voltage-controlled oscillator (VCO) 60, which supplies the required musical tone signal on an output line 14.1. In accordance with this invention, the VCO 60 is tunable to choose its operating frequency and thereby select the musical pitch called for by the keyboard. For tuning purposes, the VCO responds linearly to a current input on line 29.1. The latter input, however, using the technique described above in connection with FIG. 1, is made to vary exponentially with musical position of the selected note by means of an on-off switch 30.1 gated by a duty-cycle-modulated pulse train derived from the pulse code generator 12A. The latter in turn derives the required note selection information in the form of a multi-bit digital code word arriving over cable 42 from priority note generator 12. The tuning signal chopped by the switch 30.1 is derived over line 34.1 from a drive circuit 36.1. The latter in turn has available to it alternative modulation inputs connectable to line 38.1 by switch 44.1. These are derived over lines 20.1 and 50.1 from envelope generators 18.1 and 18.3 respectively. The envelope generators in turn respond to the input on line 16 from the priority note generator 12. The third position of switch 44.1 (terminal 46.1) is the off position, which shuts off the modulation input otherwise applied to line 38.1. Thus it will be appreciated that exponential control of the VCO in FIG. 2 can be achieved in precisely the same way as exponential control of the VCF in FIG. 1.

In order to correlate FIG. 2 with the explanation given above in connection with FIG. 1, note that identical circuit elements have been given the same reference numerals in both drawings, while those circuit elements which are not necessarily identical, but do perform corresponding functions, are given reference numerals in both drawings which are numerically similar except for the presence of a decimal suffix.

Thus it will be appreciated that, while the priority note generator 12 is not employed as a tone source in this embodiment, it is still employed as a source of controlling inputs to the pulse code generator 12A and the envelope generators 18.1 and 18.3. As in FIG. 1, the pulse code generator 12A provides the exponential control gate input to switch 30.1 for tuning the VCO to the proper pitch by chopping the input from drive circuit 36.1. If the latter is connected to one of the envelope generators 18.1 or 18.3 by switch 44.1, then the VCO-generated musical pitch will sweep over time as a function of envelope voltage. Or if the modulation input is turned off by connecting switch 44.1 to terminal 46.1, the VCO frequency or pitch will remain constant. The constant offset input on line 40.1 is used by the internal circuitry of block 36.1 to determine whether the VCO pitch (or its initial pitch, if a frequency sweep is to be performed) is equal to, or offset harmonically from, the keyboard-selected pitch.

Although the musical tone signal in FIG. 2 is derived from VCO 60 instead of from priority note generator 12, it is processed in the same way. Thus the musical tone signal on line 14.1 goes to a keyer 22.1. The latter is driven by a signal derived over line 20.1 from envelope generator 18.1, which is one of the envelope generators selectable by switch 44.1 for VCO frequency sweeping purposes. The musical tone output of the keyer 22.1 goes over a line 24.1 to a filter 26.1 which processes the musical tone before passing it on to the audio output terminal 28.

The filter 26.1 may be fixed, or it may be tunable by means of some technique other than that described in connection with FIG. 1, in which case the balance of the elements in FIG. 2 are unnecessary. But if filter 26.1 is a linear VCF tunable by the exponential technique described above, then, as described in connection with FIG. 1, its tuning is governed by an exponential current control input on line 29.2. The latter is obtained by chopping a drive input arriving over line 34.2 from drive circuit 36.2. The chopping is performed by switch 30.2 under control of the exponentially duty-cycle-modulated pulse train on line 32 coming from the same pulse code generator which controls the VCO switch 30.1. The drive circuit 36.2 has a constant pitch offset input on line 40.2, and a choice of constant or varying pitch characteristics by means of switch 44.2. The latter either connects or disconnects one of two frequency-sweeping varying voltages available on lines 20.1 and 50.2 from envelope generators 18.1 and 18.2 respectively. Envelope generator 18.1 provides VCF 26.1 with the same frequency control profile as VCO 60, whereas envelope generator 18.2 provides separate control of the VCF and VCO.

Figure 3:
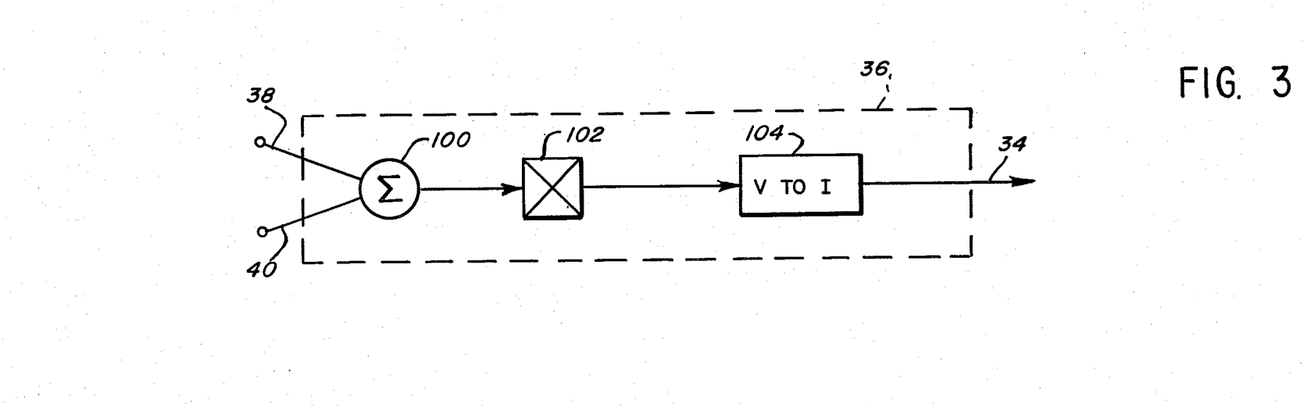
FIG. 3 is a block diagram showing some of the internal detail of the tuning control drive circuit employed in FIGS. 1 and 2.

As seen in FIG. 3, each of the tuning control drive circuits 36 of FIGS. 1 and 2 includes a summing circuit 100 which sums the modulating voltage (if any) on line 38 with the offset voltage on line 40, and provides the resulting sum output to a voltage multiplier 102. The multiplication ratio of the latter circuit is adjustable (by means subsequently described) to determine the pitch tracking interval between the VCO 60 or VCF 26 of FIGS. 1 and 2 and the musical note selected by the keyboard. The voltage output of multiplier 102 is then processed by a voltage-to-current converter circuit 104 to provide the VCO or VCF control drive signal on lines 34 of FIGS. 1 and 2. In this signal, as a result of the voltage-to-current conversion, the parameter which is linearly proportional to the sum of the inputs on lines 38 and 40 is current rather than voltage.

Figure 4:
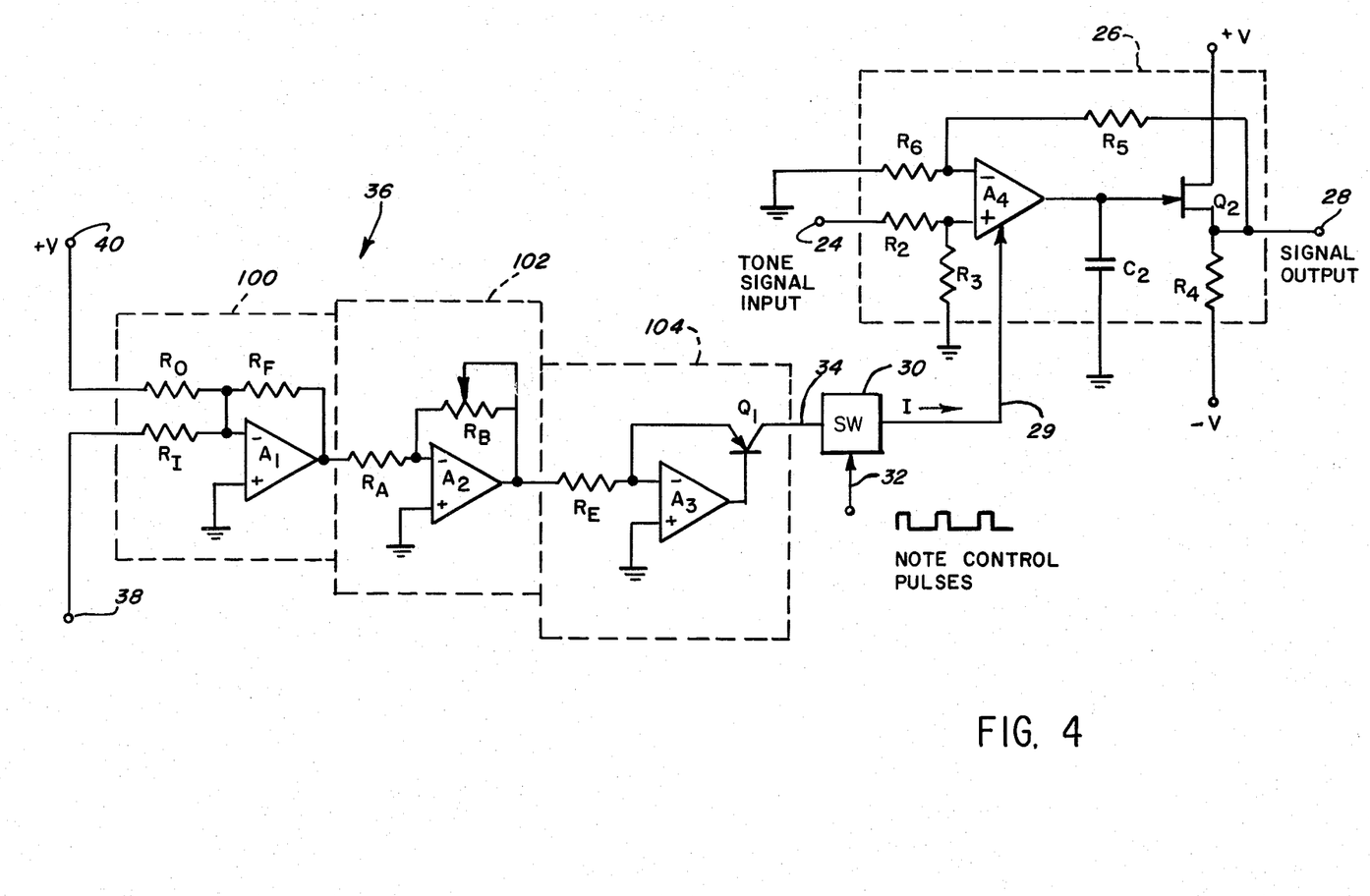
FIG. 4 is a schematic circuit diagram showing further internal detail of the tuning control drive circuit depicted in FIG. 3.

A fuller schematic representation of the drive circuit 36 and filter 26 appears in FIG. 4. The summer 100 comprises amplifier A1 and its resistor network $R_o$, $R_I$ and $R_f$. The voltage multiplier 102 comprises amplifier A2, resistor $R_A$ and potentiometer $R_B$. The gain of A2 is determined by the ratio of $R_A$ to $R_B$. Adjusting the gain of amplifier A2 (by means of potentiometer $R_B$) selects the multiplication ratio of the multiplier 102, which in turn determines the initial tracking interval or offset between the pitch to which the frequency-responsive circuit (VCO 60 or VCF 26) is tuned and the pitch of the keyboard-selected note. This initial interval is altered over time when one of the modulation voltages appears on line 38. The voltage-to-current converter 104 comprises amplifier A3, resistor RE and transistor Q1. The current output of the converter 104 on line 34 is the collector current of Q1, which equals the current through RE, and that in turn is proportional to the voltage output of amplifier A2. The switch 30 chops the current output on line 34, under control of the exponentially duty-cycle-modulated pulse code input on gate line 32.

The VCF 26 comprises two stages: a transconductance amplifier A4 and a unity gain FET buffer Q2; as is conventional (see Hutchins, cited above). The transconductance amplifier A4 is preferably an RCA integrated circuit type CA3080, and has a resistor network R6, R2 and R3. The unity gain buffer FET Q2 has a capacitor C2 and resistor R4. A feedback resistor R5 couples the output of FET Q2 to the input of amplifier A4. The pulse-modulated output of switch 30 appears on line 29 and is directed to the gain control port of amplifier A4. The tone signal input on line 24 is coupled to the transconductance stage A4 through resistor R2. If desired, conventional fan-out techniques (such as those described by Hutchins, supra) may be employed to permit the signal on line 29 to drive more than one VCF and/or VCO.

Figure 5:
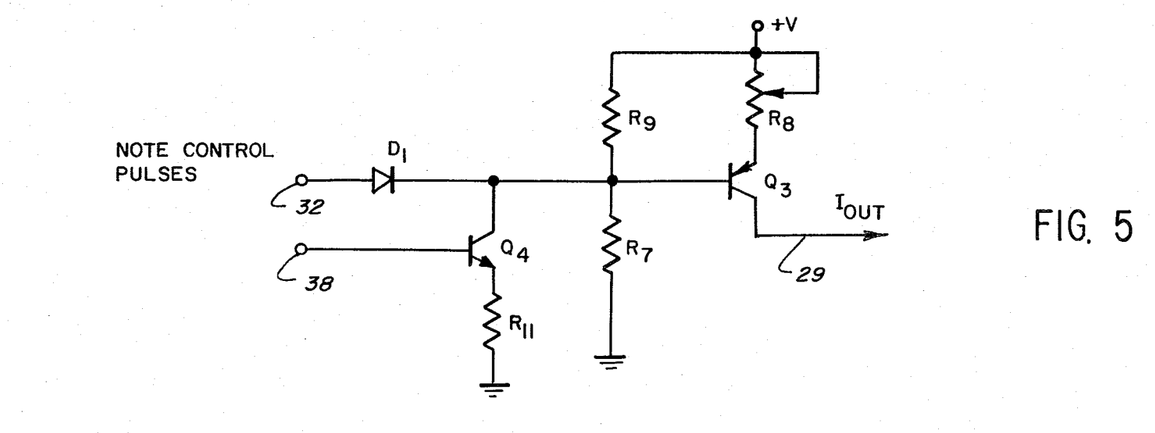
FIG. 5 is a schematic circuit diagram of another, and simplified, version of the tuning control drive circuit employed in FIGS. 1 and 2.

A simplified, but less accurate, version of the drive circuit 36 and switch 30 is illustrated in FIG. 5. This circuit has the economic advantage of combining some functions in the same circuit components, but its accuracy is impaired by emitter-base offsets. Transistor Q3 and emitter resistor R8 form a voltage-to-current converter (corresponding to circuit 104 of FIG. 4). The offset voltage (corresponding to the input on line 40 of FIG. 4) here is determined by voltage divider R9, R7. The exponentially modulated pulse input on line 32 is applied through a diode D1 to the base of Q3, which also performs the function of switch 30 in FIG. 4. The modulation signal on line 38 is applied to the base of Q4, causing its collector to add the modulation signal to the offset voltage biasing the base of switch Q3. The control pulses on line 32 cut off Q3 when they go high, but enable it when they go low. In this circuit, the initial frequency tracking interval is set by potentiometer R8 in the emitter circuit of switch Q3. The output current for controlling the VCO 60 or VCF 26 appears on Q3's collector output line 29.

Figure 6:
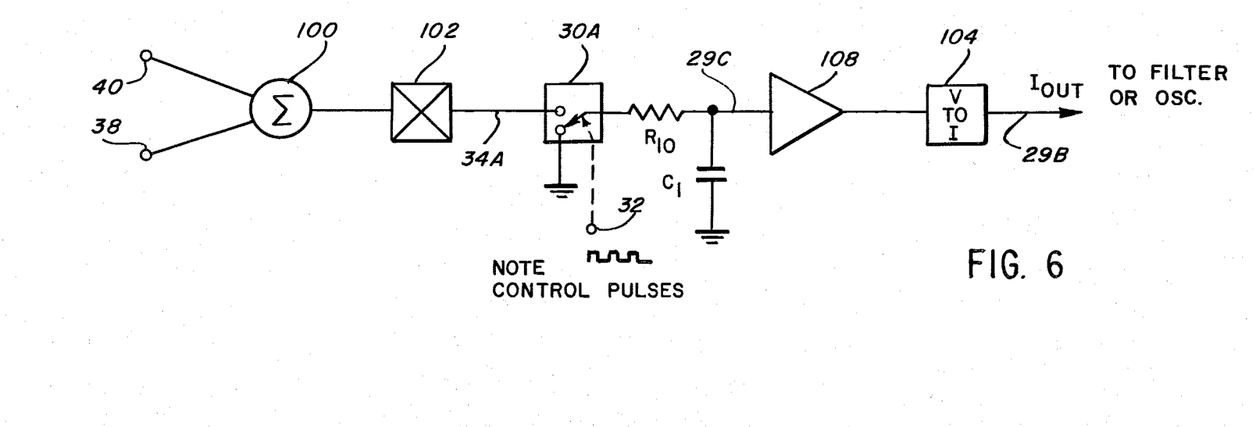
FIG. 6 is a block diagram of an alternative form of tuning control drive and switching circuit which can be employed in FIGS. 1 and 2.

Another variation of the circuit in FIGS. 3 and 4 is presented in FIGS. 6 and 7. As first seen in simplified form in the block diagram of FIG. 6, this circuit places the voltage-to-current converter 104 downstream of the exponential control switch, here designated 30A. The switch 30A itself, moreover, as shown here schematically, has a single pole, double throw operating characteristic. As a result, cycling of the switch 30A alternately charges and discharges capacitor C1 through resistor R10. Since the source of the capacitor charging voltage is the output of the multiplier 102, the average DC voltage level on the capacitor is the product of the multiplier output voltage and the duty cycle of the switch 30A. This capacitor voltage on line 29c, which now constitutes the VCO or VCF control signal voltage, is applied through a high impedance buffer stage 108 to the converter circuit 104 for conversion to a control signal current. The advantage of this FIG. 6 embodiment, compared to the embodiments of FIGS. 4 and 5, is that the FIG. 6 version does not require the internal circuitry of the controlled VCO 60 or VCF 26 to switch at high speed, because the chopped output of the switch 30A is now smoothed or integrated by capacitor C1 before reaching the VCO or VCF. A disadvantage, however, is that the ability of the VCO or VCF to track the control signal accurately now depends on the linearity of its internal circuitry.

Figure 7:
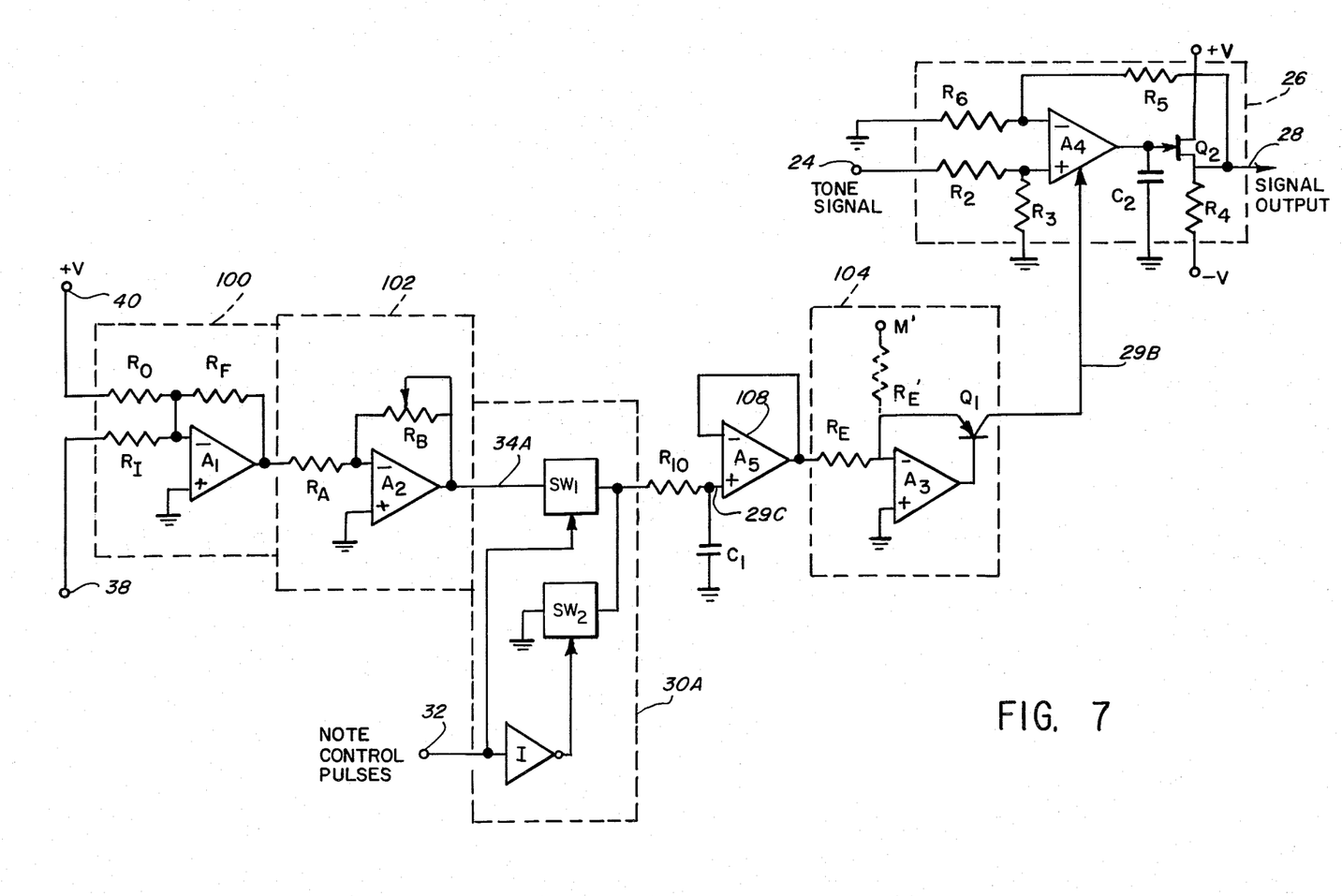
FIG. 7 is a schematic circuit diagram showing internal detail of the circuit depicted in FIG. 6.

FIG. 7 shows the embodiment of FIG. 6 in greater circuit detail. The summer 100, multiplier 102 and VCF 26 are the same as they are in FIG. 4. The exponential control switch 30A, preferably an integrated circuit of the CO4016 type, comprises two solid state switches SW1 and SW2 connected in parallel to the capacitor charging and discharging resistor R1, and controlled in common by the exponentially modulated pulse stream on line 32. Switches SW1 and SW2 are operated inversely to each other, however, by virtue of the inverter I. Thus, when SW1 is on, causing the multiplier output voltage on line 34A to charge C1, SW2 is off to prevent discharge. Conversely, when SW2 is on, discharging C1 to ground, SW1 is off, to prevent charging. The capacitor voltage is coupled through the high impedance buffer 108, comprising operational amplifier A5, to voltage-to-current converter 104, which provides the tuning signal drive over line 29B to VCF 26.

Circuit 104 here is also the same as it is in FIG. 4, with the optional exception of a modulation voltage input M' applied through a resistor $R_E'$ to the emitter of Q1. A modulation input (e.g. one of the envelope signals available on line 38) can be applied to terminal M' instead of, or in addition to, the modulation input on line 38 applied to summer 100. When applied to terminal M', the modulation input produces constant deviation modulation; i.e. a given increment in the modulation voltage applied to terminal M' produces a given numerical deviation in the frequency (or musical pitch) to which the VCF 26 or VCO 60 is tuned by the signal on line 29. Such constant deviation modulation is to be distinguished from constant musical interval modulation; the latter is the effect produced by the modulation input on line 38 applied to the summer 100. To appreciate this distinction, consider that, if a given increment delta V in the modulation voltage on terminal M' produces a change from F to 2F Hertz (a deviation of F Hertz) in the frequency to which the VCF 26 or VCO 60 is tuned, then an increment of twice delta V in the modulation voltage on terminal M' will produce a pitch deviation at the VCF 26 or VCO 60 which is twice as large in numerical frequency terms (i.e. a deviation of 2F, from F to 3F Hertz). The first pitch deviation (of F Hertz) will have a given musical interval value (in this case the change from F to 2F is one octave), but the second pitch deviation (of 2F Hertz), although twice as great in frequency terms, is not twice as great in musical interval terms (i.e. a change from F to 3F is not two octaves). Thus, an arithmetic increment in modulation voltage on terminal M' produces a merely arithmetic deviation in pitch, whereas to preserve musical interval values there must be a geometric change in pitch. A change in VCO or VCF pitch from F to 4F, not merely from F to 3F, is required to increase musical pitch by two octaves, which would be twice the musical interval change of one octave achieved by the initial increment in modulation voltage. The latter sort of change, which produces constancy of musical interval value instead of constancy of pitch deviation, is what happens when the modulation voltage is injected upstream of the multiplier 102 (e.g. when it is applied over line 38 to summer 100), because then the change in modulation voltage (delta V) is multiplied by circuit 102, and not merely added. The result then is a geometric, rather than arithmetic, change in frequency at the VCF 26 or VCO 60, producing constant interval modulation. But when the modulation voltage is injected downstream of the summer 102, as at terminal M', then the effect is merely additive, and constant deviation modulation results.

In the light of the circuit details portrayed in FIG. 7, the advantages of this embodiment may now be more fully appreciated. In the preceding embodiments, the input to the gain control port of the filter amplifier A4 on line 29 is pulsed because it is derived directly from the output of the on-off switch 30 without any integration. In following the output of switch 30, the amplifier A4 must itself act as a switch, because every time the output of switch 30 goes to zero, the gain of amplifier A4 goes to zero also, i.e. the amplifier shuts off. The switching of the amplifier places difficult design constraints upon it. Of course, the switching on and off of the amplifier A4 does not appear in the audio output of filter 26 appearing on line 28, because of the effect of capacitor C2 which integrates the output of amplifier A4 as it is applied to the input of FET Q2. Nevertheless, in the preceding embodiments such switching does occur, and it is something of a design problem. The problem is avoided by using capacitor C1 to integrate the output of switch 30A before that output reaches amplifier A4. As a result, the amplifier now merely follows the integrated average capacitor voltage, and need now switch completely off. The high impedance buffer 108 effectively couples the capacitor C1 to the amplifier A4 without providing a leakage path for capacitor discharge.

This circuit, however, places greater reliance on the linearity of filter 26 in order to track accurately the control signal on line 34B, because now all of the information in that signal is presented in analog form, i.e. a current level. Previously, at least part of the information in that signal was presented in digital form because of the exponential chopping.

Figure 8:
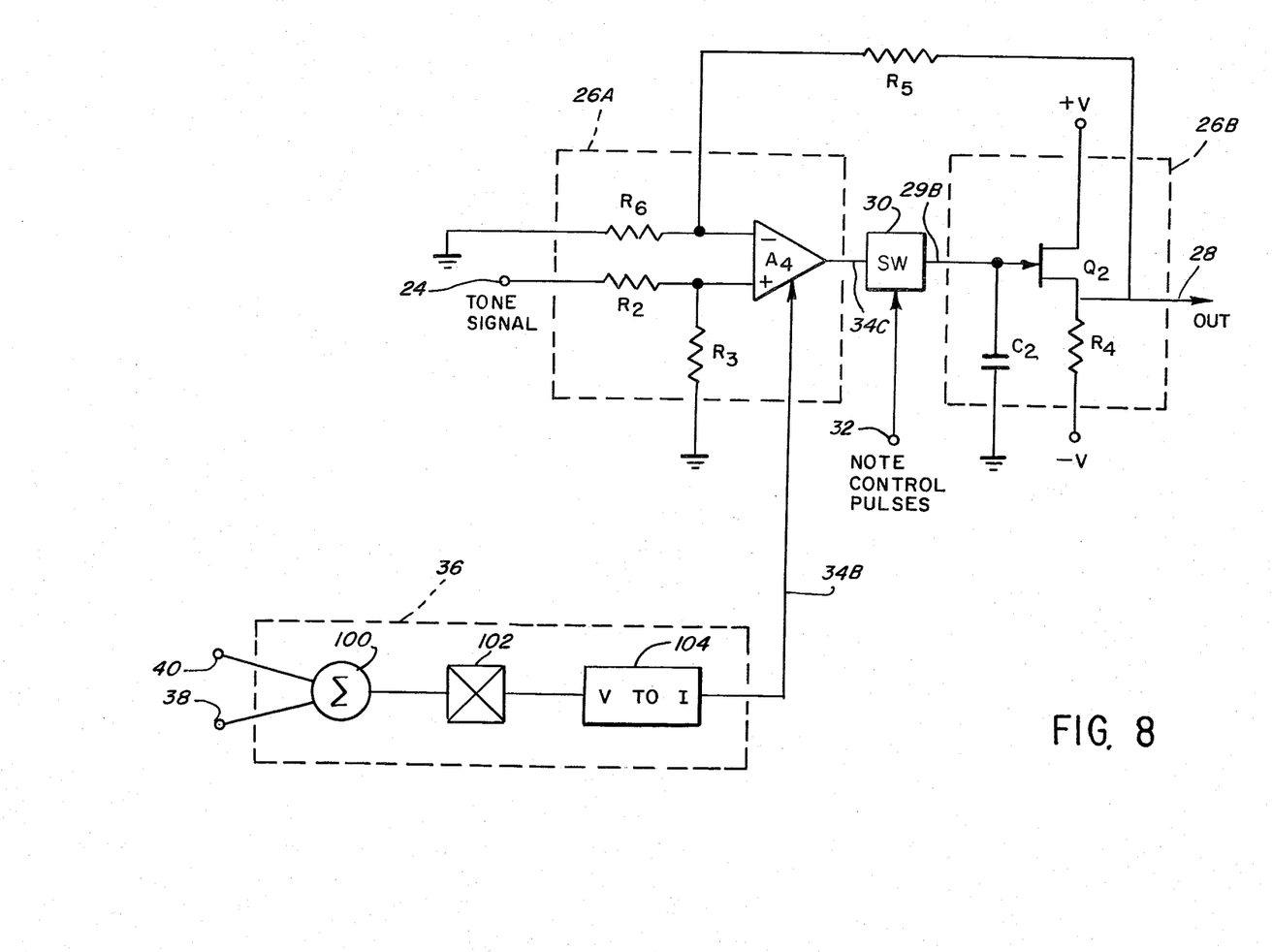
FIG. 8 is a block and schematic circuit diagram showing one more alternative form of tuning control drive and switching circuit which can be employed in FIGS. 1 and 2.

One more variation of the basic circuit is shown in FIG. 8, where the general arrangement is the same as in FIG. 4 except that switch 30, instead of coupling the V-to-I converter 104 to the filter 26, couples the first, or transconductance amplifier stage 26A of filter 26 to the second, or buffer stage 26B thereof. The output of the V-to-I converter 104 on line 34B goes directly to the filter tuning control (the gain control port of amplifier A4) in this embodiment, while the output of amplifier A4 on line 34C provides the input of switch 30. The switch output on line 29B then goes to the input to buffer stage FET Q2.

Here again, the advantage of this embodiment is that it avoids the necessity for amplifier A4 to follow the on-off operation of the switch 30. Instead, the input to the amplifier gain control port is a smoothly varying signal from the drive circuit 36 on line 34B. It is only the output of the amplifier A4 which is coupled to the switch 30. The pulsed switch output, instead of controlling the amplifier gain directly, is applied to the input of the second (or buffer) stage 26B of filter 26, where it is integrated by the capacitor C2. The only effect of switch 30 on amplifier A4 is the effect produced by the integrated output of capacitor C2 via FET Q2 and feedback resistor R5. Thus, once again, amplifier A4 is spared the necessity of switching on and off, because its gain control voltage is never entirely cut off.

Figure 9:
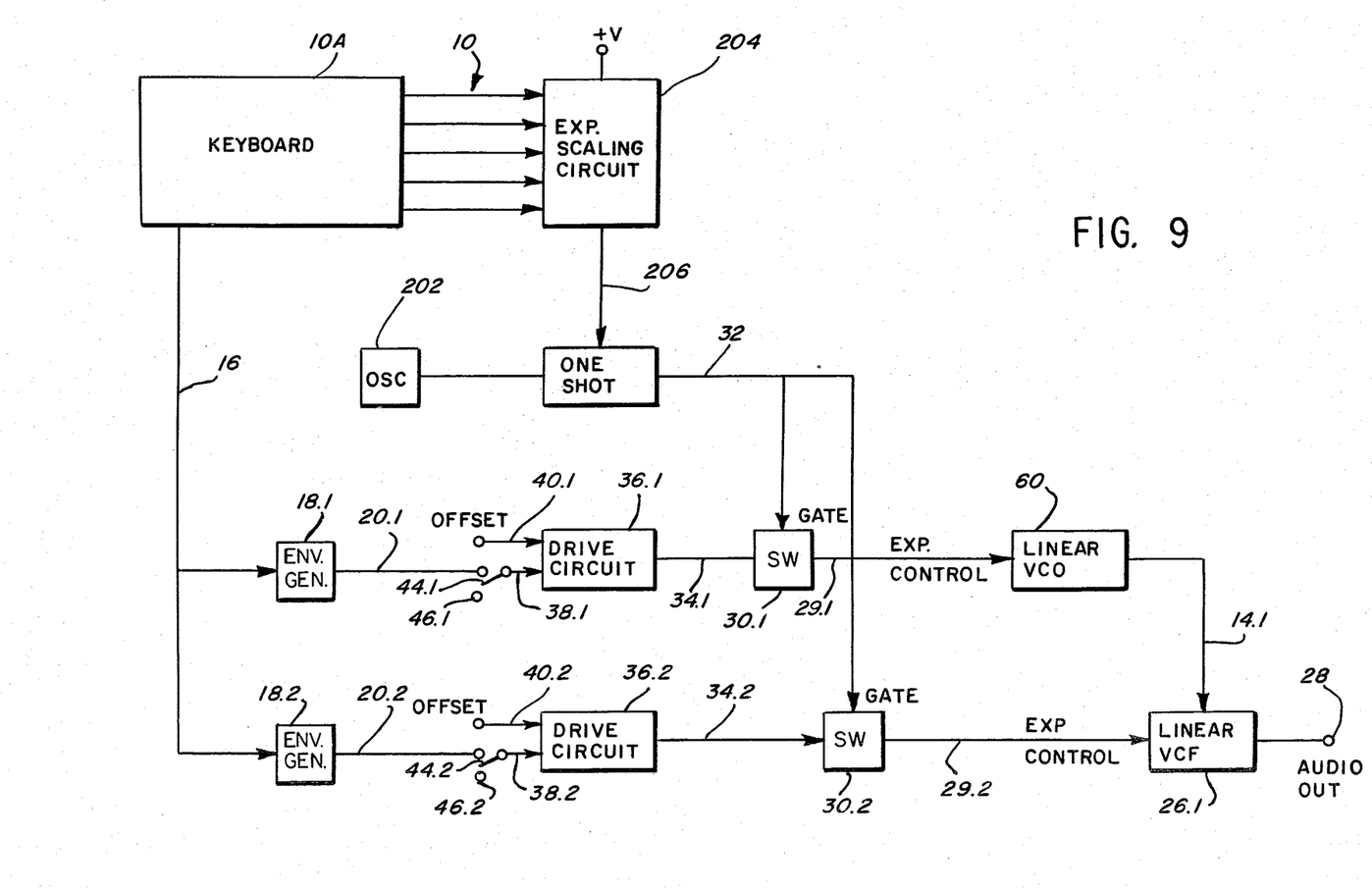
FIG. 9 is a block diagram showing an instrument which differs from that depicted in FIG. 2, in that the exponential pulse stream is generated by the use of a one-shot circuit controlled by an analog exponential scaling technique.

The circuit of FIG. 2 differs from FIG. 1 in that it does not rely on the priority note generator as a tone source. But it does not entirely eliminate the priority note generator, since the latter circuit (and its component part, the pulse code generator) are used in FIG. 2 to develop the exponentially modulated pulse train. If it is desired to eliminate the priority note generator and pulse code generator entirely, then the arrangement of FIG. 9 may be used. In FIG. 9 (where the same numbering scheme as in FIG. 2 is used) once again VCO 60 is used (instead of a priority note generator) to generate the musical tone signal on line 14.1. Once again that signal is processed by filter 26.1 before appearing at audio output terminal 28. And once again, one or both of the circuits 60 and 26.1 is of the so-called voltage controlled type (VCO and/or VCF) which responds linearly to tuning control current inputs on lines 29.1 and/or 29.2 respectively. Once again these inputs are derived from drive circuits 36.1 and/or 36.2 respectively, and chopped exponentially by switches 30.1 and/or 30.2 respectively. But here the exponentially duty-cycle-modulated pulse train on line 32, which gates the switches, is derived from a one-shot (monostable multivibrator) circuit 200. Each pulse in the train represents one cycle of the one-shot 200. The latter is repeatedly cycled because it is driven by a free-running oscillator 202. Thus the pulse train on line 32 consists of a stream of one-shot output pulses occurring at a fixed repetition rate equal to the frequency of oscillator 202. In order to modulate the duty cycle of this pulse train, the pulse duration must be controlled. This is accomplished, in the required exponential fashion, by an exponential scaling circuit 204. The latter applies a voltage over line 206 to the one-shot 200, and the magnitude of this voltage determines the one-shot cycle time (in a manner to be described). The magnitude of the voltage, in turn, varies exponentially as a function of which one of the musical note selection lines 10 is energized by the keyboard (here designated 10a) of the musical instrument. Thus, as the musician indicates his note selections by pressing successive keys on the keyboard 10A, the note selection informaion represented by lines 10 causes scaling circuit 204 to modulate the voltage on line 206. This in turn varies the cycle time of one-shot 200, resulting in modulation of the duty cycle of the pulse train on line 32 which gates the switches 30.1 and 30.2.

The switches in turn chop the VCO and VCF control signals derived from the drive circuits 36.1 and 36.2. Each of these drive circuits has a choice of modulation inputs on lines 38.1 and 38.2, determined by the positions of switches 44.1 and 44.2 as described above, in connection with FIGS. 1 and 2. One of these inputs, the special effects input on line 20.1 or 20.2, is derived from envelope generator 18.1 or 18.2 respectively, just as in FIGS. 1 and 2. Here, however, since there is no priority note generator, the drive line 16 for the envelope generators 18 is energized directly from the keyboard 10A by means of a switch which closes when any of the musical keys is operated.

Figure 10:
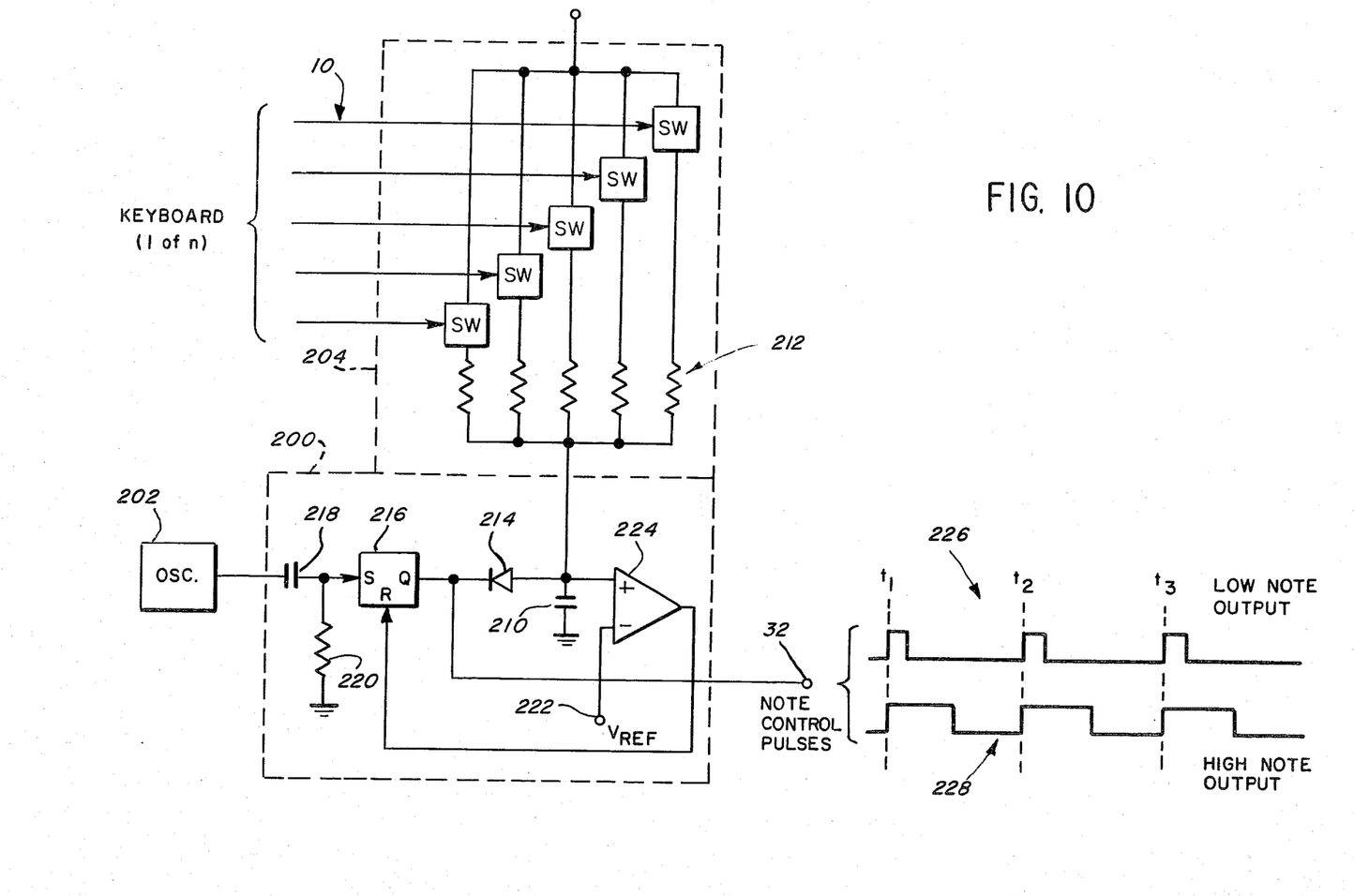
FIG. 10 is a schematic circuit diagram showing details of the one-shot and exponential scaling circuits employed in FIG. 9.

FIG. 10 shows in detail how the exponential scaler 204 and one-shot 200 cooperate to produce exponentially scaled pulse duration modulation. The pulse duration timing network of the one-shot 200 is an RC circuit including capacitor 210 in the one-shot circuit and a selected one of n different-valued resistors 212 in the scaling circuit 204. When one of the n keyboard keys is operated, its corresponding line 10 is energized. The keyboard lines 10 are connected to the respective gate electrodes of n switches S (preferably the same solid state type of switch as the switch 30 described above). The selected one of the switches S is turned on by the gate voltage on its associated line 10. As a result, the supply voltage is connected through the one enabled switch S to its associated resistor 212. However, the process of charging the one-shot timing capacitor 210 does not begin at this time, because the capacitor is connected through a diode 214 to a ground (not shown) internal to the flip-flop circuit 216, which is initially reset.

When the next cycle of the oscillator 202 activates the one-shot circuit 200, however, a spike is coupled to the Set input of the flip-flop through a differentiating network comprising series capacitor 218 and shunt resistor 220. This spike sets the flip-flop 216, causing its Q output to go high, back-biasing diode 214 and thereby blocking the discharge path of timing capacitor 210. At this point, charging of the timing capacitor 210 begins. The charging rate of course depends on the value of the particular one of the resistors 212 which is in use, which in turn depends on which switch S is enabled, and that is a function of which line is selected by the keyboard. Thus, the capacitor charging rate is a function of musical note selection.

After the passage of a period of time, the duration of which depends on the capacitor charging rate, the capacitor voltage rises to the level of a reference voltage on supply terminal 222. This condition is then detected by a comparator 224, which thereupon produces a positive output to reset the flip-flop 216, terminating the one-shot cycle, and allowing the timing capacitor 210 once again to discharge rapidly to ground through the Q terminal of the flip-flop. During the time that the flip-flop is set, a high Q output appears on the one-shot output line 32; that is the pulse which serves to gate the switches 30 in FIG. 9. When the flip-flop 216 is reset, the Q output on line 32 goes low, terminating the pulsed gate drive to switches 30. The duration of each Q output pulse on line 32 is equal to the flip-flop set time, which is longer when the timing capacitor 210 takes a longer time to charge (i.e. when a higher value resistor 212 is selected).

Thus the duration of the switch gate pulses on line 32 is a function of the value of the selected resistor 212. All that remains, then, to make the pulse duration vary exponentially with musical scale position, is to select the values of resistor 212 so that they vary exponentially from step to step along the musical scale. Thus, when a low note is selected by the keyboard, a low-valued resistor 212 is used to charge the timing capacitor 210 quickly, and the duration of the one-shot output pulses (see waveform 226) is brief. Conversely, when a high note key is operated, a high-valued resistor 212 is used to charge the timing capacitor 210 slowly, and the duration of the one-shot output pulses (see waveform 228) is longer. In waveforms 226 and 228 the corresponding pulses start at the same time, i.e. times $t_1$, $t_2$, $t_3$, so that their repetition rate (governed by the frequency of oscillator 202) is the same. But their durations are different, and scaled in proportion to the values of resistors 212, that is, exponentially. The resulting exponentially modulated pulse train is equivalent to that produced in FIGS. 1 and 2 for VCO and VCF control purposes, but does not require a digital priority note generator or pulse code generator.

It will be appreciated that the various embodiments of this invention merely exemplify a fundamental technique of VCO or VCF control, by providing an exponentially modulated switching function to chop a control signal which tailors the frequency characteristics of the circuit according to the inherent nonlinear nature of musical pitch relationships, and that it is this technique which is broadly stated in the appended claims.

What is claimed is:

1. An electronic music circuit comprising:
    means for selecting a note on a musical scale;
    means responsive to said musical note selection means to produce a musical tone signal at the frequency of the note selected thereby;
    at least one frequency-dependent circuit having an input connected to receive said musical tone signal and a separate frequency response control input, the frequency response of said frequency-dependent circuit varying as a substantially linear function of a current delivered to said frequency response control input;
    an on-off switch having a signal input, a signal output, and an on-off control;
    means for delivering to said signal input of said on-off switch an unchopped tuning signal which is separate from said musical tone signal;
    a pulse source responsive to said musical note selection means to generate a series of control pulses having a duty cycle which is an exponential function of the musical scale position of said selected musical note, and connected to apply said control pulses to said on-off switch control so as to turn said switch on during each control pulse and off between control pulses for chopping said tuning signal at an exponential rate; and means responsive to said signal output of said on-off switch to deliver to said frequency response control input a current proportional to the duty cycle of said chopped tuning signal, whereby the frequency response of said frequency-dependent circuit varies as an exponential function of the unchopped tuning signal.

2. A circuit as in claim 1 wherein said frequency-dependent circuit is a filter used as a musical tone processor, the frequency characteristics of said filter being tunable in response to said tuning drive signal.

3. A circuit as in claim 2 wherein:
said pulse source comprises a priority note generator arranged to transmit a digital word identifying said selected note, and a pulse code generator responsive to said digital word to transmit a pulse stream, the duty cycle of which is exponentially related to the position on the musical scale of the note so identified;
said pulse stream being coupled to said switch on-off control;
said priority note generator being arranged to generate a musical tone signal at the frequency of the note so identified; and
means are arranged to couple said tunable filter to said musical tone signal for processing thereof.

4. In an electronic musical instrument having means for selecting a note on a musical scale, and at least one frequency-dependent circuit having at least one stage, the frequency response of said circuit being tunable as a substantially linear function of a tuning signal current; an exponential tuning signal conversion circuit comprising:
an on-off switch having a signal input, a signal output, and an on-off control;
circuit means providing a tuning drive signal;
a source providing control pulses having a duty cycle exponentially related to the position of said selected note on said musical scale;
means coupling said switch signal input to said tuning drive signal;
means coupling said switch signal output to at least one stage of said frequency-dependent circuit whereby to control the tuning thereof; and
means coupling said switch on-off control to turn said switch on and off in response to said pulse source whereby said exponential pulse duty cycle causes said frequency response of said frequency-dependent circuit to vary as an exponential function of said musical scale position of said selected note;
said frequency-dependent circuit being an oscillator employed as a musical tone generator, the operating frequency of said oscillator being tunable in response to said tuning drive signal.

5. A circuit as in claim 4 wherein:
said pulse source comprises a priority note generator arranged to transmit a digital word identifying said selected note, and a pulse code generator responsive to said digital word to transmit a pulse stream, the duty cycle of which is exponentially related to the position on the musical scale of the note so identified;
said pulse stream being coupled to said switch on-off control.

6. A circuit as in claim 4 further comprising:
a filter having at least one stage, the frequency characteristics of said filter being tunable in response to a tuning drive signal;

means coupling said filter to process said musical tone signal generated by said tunable oscillator;
a second on-off switch;
means providing a second tuning drive signal;
said second switch having an input, an output and an on-off control;
means coupling said second switch input to said second tuning drive signal;
means coupling said second switch output to at least one stage of said filter whereby to control the tuning thereof; and
means coupling said second switch on-off control to turn said second switch on and off in response to said pulse source;
whereby said exponential pulse duty cycle causes said frequency response of said filter to vary as an exponential function of said tuning drive signal.

7. A circuit as in claim 1 wherein said pulse source comprises:
an oscillator;
a one-shot circuit triggered at regular intervals by said oscillator to provide said pulses, said one-shot having a power input, the cycle time of said one-shot circuit determining the duty cycle of said pulses, and being a substantially linear function of the current received at said power input; and
a current scaling circuit coupled to provide current to said power input of said one-shot circuit, and including means for scaling said current in exponential steps as a function of the musical scale position of said selected note.

8. A circuit as in claim 7 wherein:
said one-shot circuit includes a reactive component, the charging rate of which determines said cycle time, said reactive component being connected in series with said current scaling circuit, whereby the scaling of said current controls said cycle time; and
said current scaling circuit includes a plurality of impedances with exponentially scaled values, and switching means for connecting a selected one of said impedances in series with the charging circuit of said reactive component as a function of the musical scale position of said selected note.

9. In an electronic musical instrument having means for selecting a note on a musical scale, and at least one frequency-dependent circuit having at least one stage, the frequency response of said circuit being tunable as a substantially linear function of a tuning signal current; an exponential tuning signal conversion circuit comprising:
an on-off switch having a signal input, a signal output, and an on-off control;
circuit means providing a tuning drive signal;
a source providing control pulses having a duty cycle exponentially related to the position of said selected noted on said musical scale;
means coupling said switch signal input to said tuning drive signal;
means coupling said switch signal output to at least one stage of said frequency-dependent circuit whereby to control the tuning thereof; and
means coupling said switch on-off control to turn said switch on and off in response to said pulse source whereby said exponential pulse duty cycle causes said frequency response of said frequency-dependent circuit to vary as an exponential function of said musical scale position of said selected note;
said tuning drive signal circuit means comprising;

summing means having at least two inputs;
and a multiplier responsive to an output from said summing means.

10. A circuit as in claim 9 wherein said tuning drive signal circuit further comprises:
a voltage-to-current converter responsive to an output from said multiplier.

11. A circuit as in claim 10 wherein said switch input receives the output of said multiplier, said means for coupling said switch output to control the tuning of said frequency-dependent circuit comprises an integrating capacitor, a high impedance buffer, and said voltage-to-current converter, and said switch operates in the single pole, double throw mode and is connected to alternately charge said integrating capacitor from the output of said multiplier during said control pulses and to discharge said capacitor between said control pulses, whereby the average voltage on said integrating capacitor is proportional to the duty cycle of said control pulses.

12. A circuit as in claim 10 wherein said switch input receives the output of said voltage-to-current converter.

13. In an electronic musical instrument having means for selecting a note on a musical scale, and at least one frequency-dependent circuit having at least one stage, the frequency response of said circuit being tunable as a substantially linear function of a tuning signal current; an exponential tuning signal conversion circuit comprising:
an on-off switch having a signal input, a signal output, and an on-off control;
circuit means providing a tuning drive signal;
a source providing control pulses having a duty cycle exponentially related to the position of said selected note on said musical scale;
means coupling said switch signal input to said tuning drive signal;
means coupling said switch signal ouput to at least one stage of said frequency-dependent circuit whereby to control the tuning thereof; and
means coupling said switch on-off control to turn said switch on and off in response to said pulse source whereby said exponential pulse duty cycle causes said frequency response of said frequency-dependent circuit to vary as an exponential function of said musical scale position of said selected note;
said frequency-dependent circuit comprising a first stage and a second stage, said first stage receiving said tuning drive signal and coupling it to said switch input, and said means for coupling said switch output to control the tuning of said frequency-dependent circuit comprises said second stage of said frequency-dependent circuit.

14. In an electronic musical instrument having means for selecting a note on a musical scale, and at least one frequency-dependent circuit having at least one stage, the frequency response of said circuit being tunable as a substantially linear function of a tuning signal current; and exponential tuning signal conversion circuit comprising:
an on-off switch having a signal input, a signal output, and an on-off control;
circuit means providing a tuning drive signal;
a source providing control pulses having a duty cycle exponentially related to the position of said selected note on said musical scale;
means coupling said switch signal input to said tuning drive signal;
means coupling said switch signal output to at least one stage of said frequency-dependent circuit whereby to control the tuning thereof; and
means coupling said switch on-off control to turn said switch on and off in response to said pulse source whereby said exponential pulse duty cycle causes said frequency response of said frequency-dependent circuit to vary as an exponential function of said musical scale position of said selected note;
said switch comprising a transistor, the collector of said transistor comprising the switch output coupled to control the tuning of said frequency-dependent circuit, the emitter of said transistor comprising said switch input, the base of said transistor comprising said switch on-off control, and a voltage divider being coupled to said transistor base to bias it to an operating point representing an initial offset signal for controlling the frequency response of said frequency-dependent circuit.

15. The circuit as in claim 14 further comprising a modulation stage having an output coupled to the base of said transistor and an input coupled to a modulation signal.

16. A circuit as in claim 9 further comprising means for applying a varying pitch modulation input to said tuning drive circuit, said tuning drive circuit being responsive to changes in said pitch modulation input to alter the frequency to which said frequency-dependent circuit is tuned.

17. A circuit as in claim 16 wherein said pitch modulation signal is applied to said tuning drive circuit on the input side of said multiplier so that said pitch modulation signal is multiplied thereby, in order to achieve constant musical interval modulation of pitch.

18. A circuit as in claim 17 wherein said pitch modulation signal comprises one of said inputs to said summing means, said tuning drive circuit being responsive to changes in the output of said summing means to alter the frequency to which said frequency-dependent circuit is tuned.

19. A circuit as in claim 18 wherein a constant pitch offset voltage comprises another of said inputs to said summing means.

20. A circuit as in claim 16 wherein said pitch modulation signal is applied to said tuning drive circuit on the output side of said multiplier so that said pitch modulation signal is not multiplied thereby, in order to achieve constant deviation modulation of pitch.

21. A circuit as in claim 1 wherein said frequency-dependent circuit has an amplifier with a gain control input, said amplifier gain control input is said frequency response control input of said frequency-dependent circuit, and said frequency response of said frequency-dependent circuit is a substantially linear function of a current delivered to said amplifier gain control input.

22. In an electronic music circuit of the type having means for selecting a note on a musical scale, means responsive to said musical note selection means to produce a musical tone signal at the frequency of the note selected thereby, at least one frequency-dependent circuit having an input connected to receive said musical tone signal, the frequency response of said frequency-dependent circuit with respect to the frequency of said musical tone signal varying as a substantially linear function of said musical tone signal current, means responsive to said musical tone signal to provide a signal which is a function of said musical tone signal, an on-off switch connected in series with said functionally related signal and having an on-off control, and a source responsive to said musical note selection means for applying to said on-off control of said switch a series of pulses the duty cycle of which is exponentially related to the musical scale position of said selected note whereby said musical tone signal current is chopped by said on-off switch to control the frequency response of said frequency-dependent circuit as an exponential function of said musical scale position; the improvement wherein:
    said frequency-dependent circuit includes an amplifier stage with a gain control input, the frequency response of said frequency-dependent circuit being a function of the gain of said amplifier stage as well as of the musical tone signal current; and
    means for applying an additional signal to said gain control input of said amplifier whereby to further alter said frequency response characteristic.

23. In an electronic music circuit of the type having means for selecting a note on a musical scale, means responsive to said musical note selection means to produce a musical tone signal at the frequency of the note selected thereby, at least one frequency-dependent circuit having an input connected to receive said musical tone signal, means including an on-off switch having an on-off control input and arranged to alter the frequency response of said frequency-dependent circuit as a function of the duty cycle of said switch, and a source responsive to said musical note selection means for applying to said on-off control of said switch a series of pulses the duty cycle of which is exponentially related to the musical scale position of said selected note, whereby to control the frequency response of said frequency-dependent circuit as an exponential function of said musical scale position; the improvement wherein said pulse source comprises:
    a clock which operates at a fixed high frequency, means responsive to said musical note selecting means to represent said selected musical note in digital code form, means responsive to said digital code note representation for digitally processing the output of said clock to produce a stream of pulses the duty cycle of which is an exponential function of said musical scale position of said selected note, and means coupling said pulse stream to said on-off control of said switch.

* * * * *